(12) United States Patent
Londergan et al.

(10) Patent No.: US 6,720,259 B2
(45) Date of Patent: Apr. 13, 2004

(54) PASSIVATION METHOD FOR IMPROVED UNIFORMITY AND REPEATABILITY FOR ATOMIC LAYER DEPOSITION AND CHEMICAL VAPOR DEPOSITION

(75) Inventors: Ana R. Londergan, Campbell, CA (US); Sasangan Ramanathan, San Ramon, CA (US); Jereld Winkler, Union City, CA (US); Thomas E. Seidel, Sunnyvale, CA (US)

(73) Assignee: Genus, Inc., Sunnyvale, CA (US)

( * ) Notice: Subject to any disclaimer, the term of this patent is extended or adjusted under 35 U.S.C. 154(b) by 0 days.

(21) Appl. No.: 10/262,992

(22) Filed: Oct. 2, 2002

(65) Prior Publication Data

US 2004/0023516 A1 Feb. 5, 2004

Related U.S. Application Data

(60) Provisional application No. 60/326,893, filed on Oct. 2, 2001.

(51) Int. Cl.[7] ............................................. H01L 21/31
(52) U.S. Cl. .................... 438/680; 438/681; 438/785; 427/248.1
(58) Field of Search ................................. 438/680, 681, 438/785; 427/248.1, 255.39, 585

(56) References Cited

U.S. PATENT DOCUMENTS

| 4,493,142 A | * | 1/1985 | Hwang ........................ 29/575 |
| 5,728,629 A | * | 3/1998 | Mizuno et al. ............. 438/680 |
| 5,843,239 A | * | 12/1998 | Shrotriya et al. ............. 134/1.1 |
| 6,251,793 B1 | * | 6/2001 | Wicker et al. ............... 438/710 |
| 6,420,279 B1 | * | 7/2002 | Ono et al. ................... 438/785 |
| 2003/0049372 A1 | * | 3/2003 | Cook et al. ............... 427/248.1 |

* cited by examiner

*Primary Examiner*—Alexander Ghyka
(74) *Attorney, Agent, or Firm*—Blakely Sokoloff Taylor & Zafman LLP (57) ABSTRACT

A method to deposit a passivating layer of a first material on an interior reactor surface of a cold or warm wall reactor, in which the first material is non-reactive with one or more precursor used to form a second materials. Subsequently when a film layer is deposited on a substrate by subjecting the substrate to the one or more precursors, in which at least one precursor has a low vapor pressure, uniformity and repeatability is improved by the passivation layer.

30 Claims, 4 Drawing Sheets

PASSIVATION METHOD FOR IMPROVED UNIFORMITY AND REPEATABILITY FOR ATOMIC LAYER DEPOSITION AND CHEMICAL VAPOR DEPOSITION

This application claims the benefit of priority from U.S. Provisional Patent Application Serial No. 60/326,893 entitled "Passivation Methods for Improved Uniformity and Repeatability for Atomic Layer Deposition" filed on Oct. 2, 2001.

FIELD OF THE INVENTION

The present invention relates to semiconductor processing and, more particularly, to a method for improved control of uniformity and repeatability in Atomic Layer Deposition and/or Chemical Vapor Deposition.

BACKGROUND OF THE RELATED ART

Chemical Vapor Deposition (CVD) is a widely used deposition process for the growth of thin films on various substrates, including semiconductor wafers. As microelectronics device dimensions are reduced, or scaled down, CVD is becoming an attractive method for the deposition of conformal films over complex device topography. Additionally, new materials are considered in the design of advanced devices. For example, high dielectric constant (k) oxide materials are attractive alternative to the conventionally employed silicon-based oxides for use as gate or capacitor dielectrics. Recently, some dynamic random access memory (DRAM) products have been manufactured, in which CVD is used to deposit high-k tantalum pentoxide ($Ta_2O_5$).

In the field of material deposition, a process known as Atomic Layer Deposition (ALD) has emerged as a promising candidate to extend the abilities of CVD techniques. Generally, ALD is a process wherein conventional CVD processes are divided into separate deposition steps that theoretically go to saturation at a single molecular or atomic monolayer thickness and self-terminate. For ALD applications, the molecular precursors are introduced into the reactor separately. Typically, an ALD precursor reaction is followed by inert gas purging of the reactor to remove the precursor from the reactor prior to the introduction of the next precursor.

One way of classification of the CVD/ALD type of deposition reactors is by the temperature at which the reactor wall is maintained with respect to the deposition temperature of a substrate resident in the reactor. In "cold wall" and "warm wall" reactors, the reactor chamber wall (or vacuum containing surface) is maintained at a temperature that permits physisorption or limited (or imperfect, or partial) chemisorption. This is in contrast to hot wall reactors where the wall temperature is close to or near the substrate deposition temperature, where chemisorption and deposition takes place by design.

In CVD the films are deposited from molecular precursors that are carried to the reactor in a vapor state, typically mixed with an inert carrier gas. A substrate is kept at temperature that is optimized to promote chemical reaction between the molecular precursors concurrent with efficient desorption of byproducts. Accordingly, the reaction proceeds to deposit the desired pure film. The selection of a suitable precursor is a key in CVD, as there are a number of restrictions on the precursor's physical and chemical properties. In particular, the precursor should be of sufficient volatility at temperatures below the decomposition temperature in order for the vapors to be transported to the reactor without premature decomposition. The requirement for saturation of the precursor reactions in ALD imposes additional constraints on the potential precursors.

Generally the precursors for CVD and ALD fall in 3 categories based on their volatility: 1) gases (e.g., $NH_3$ and $WF_6$); 2) high vapor pressure (e.g., 5 to 40 Torr @ room temperature (RT)) liquids (e.g., trimethyl aluminum (TMA), $SiCl_4$, $TiCl_4$, $H_2O$) and solids (e.g., $W(CO)_6$); and 3) low vapor pressure (e.g., less than 0.5 Torr @ RT) liquids (e.g., some metal organic Zr, Ta, and Hf precursors) and solids (e.g., $TaCl_5$, $HfCl_4$, $ZrCl_4$). Additionally some solids may be dissolved in a solvent and handled as liquids. While gases and high vapor pressure precursors are clearly desirable, such precursors are not available for the deposition of pure, high quality films by CVD or ALD.

Containers for precursors with high vapor pressure are typically maintained at room temperature and some gas lines between the precursor container and CVD or ALD reactor may be heated to a moderate temperature (e.g., <100° C.) to reduce adsorption or condensation. In warm and/or cold (warm/cold) wall reactors, the reactor chamber walls are typically maintained at or below the temperature where precursor condensation occurs. In contrast, the containers for precursors with low vapor pressure are typically maintained at high temperature to generate sufficient vapor and gas lines between the precursor container and CVD or ALD reactor are usually heated to a temperature higher than the temperature of the precursor container to prevent condensation. When the precursor container temperature is higher than the temperature of some inner reactor surfaces, precursor condensation typically occurs on these surfaces. In CVD processes this may cause thickness non-uniformity due to precursor depletion and consequently different deposition rate on different areas on the substrate. In ALD processes some of the condensed precursor may be desorbed and travel to some areas of the substrate surface simultaneously with the second precursor, resulting in excess film thickness deposition on these areas of the substrate. The precursor that remains condensed on the reactor surfaces may react with the second precursor to form a parasitic film on these surfaces. Typically this film is of poor or inferior quality compared to the quality of the film deposited on the substrate. The net effect is depletion of one or both precursors which may result in less film thickness on some areas of the substrate due to insufficient precursor delivery to the substrate surface. Thus, various mechanisms may contribute to non-uniform film deposition and also lead to gradual deterioration of the thickness uniformity and repeatability of deposited films over time.

Thus, a need is present to improve uniformity and repeatability when depositing a film layer in ALD and CVD reactors. The need is more pronounced in depositing films on substrates using low vapor pressure precursors.

SUMMARY

A technique to deposit a passivating layer by a first chemical process on a cold or warm wall CVD or ALD reactor to improve uniformity of a film layer deposited on a substrate resident in a reactor chamber. The passivating layer is deposited as a non-reactive (inert) coating on surfaces where parasitic deposition may occur by remnants of a precursor chemical used to deposit the film layer remaining on the surfaces of the chamber. The passivating layer is non-reactive with one or more precursors used to deposit the film layer on the substrate. In one embodiment $Al_2O_3$ is used as a passivation layer for deposition of film layers of high-k dielectrics, $ZrO_2$ and $HfO_2$.

BRIEF DESCRIPTION OF THE DRAWINGS

Embodiments of the present invention are illustrated by way of example and are not for the purpose of limitation. In the figures of the accompanying drawings, similar references are utilized to indicate similar elements.

DETAILED DESCRIPTION OF THE INVENTION

In the description below, the present invention is described in reference to various embodiments. In order to understand the invention, particular examples are given. The example embodiments describe the deposition of $ZrO_2$ and $HfO_2$ and processes related to depositing $ZrO_2$ and $HfO_2$ film layers on a substrate. Furthermore, the processes described pertain to ALD and CVD. However, the invention is not limited to these processes or chemistries. Thus, other materials, including films other than high-k materials, may be readily deposited utilizing the passivation techniques of the present invention. Additionally, the invention is more applicable with cold and/or warm (cold/warm) wall reactors, which are defined as a vacuum containing surface that is maintained at a temperature that permits physisorption or limited or imperfect or partial chemisorption. This is in contrast to hot wall reactor whose wall temperature is close to or near the substrate temperature, where chemisorption and film deposition takes place by design.

In the deposition of $ZrO_2$ and $HfO_2$, one of the more common inorganic metal precursors used to deposit $ZrO_2$ and $HfO_2$ are $ZrCl_4$ and $HfCl_4$, respectively. Both materials are solids with low vapor pressure. Therefore, they are typically heated to a temperature in the approximate range of 155–180° C. in order to generate sufficient vapor for film deposition. The vapors are carried to an ALD reactor with the use of an inert carrier gas, such as Ar, He or $N_2$. For ALD, $ZrO_2$ films are grown by alternating $ZrCl_4$ and $H_2O$ pulses, in the fashion typically employed with known ALD reactors. Similarly, ALD $HfO_2$ films are grown by alternating $HfCl_4$ and $H_2O$ precursor pulses in an ALD reactor.

Figure 1A:
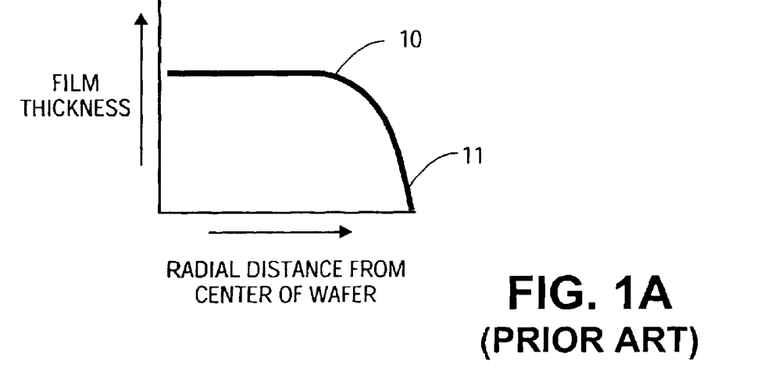
FIG. 1A is a graphic illustration of a prior art deposition process in which the deposition thickness of the film layer decreases at the periphery of the wafer.
Figure 1B:
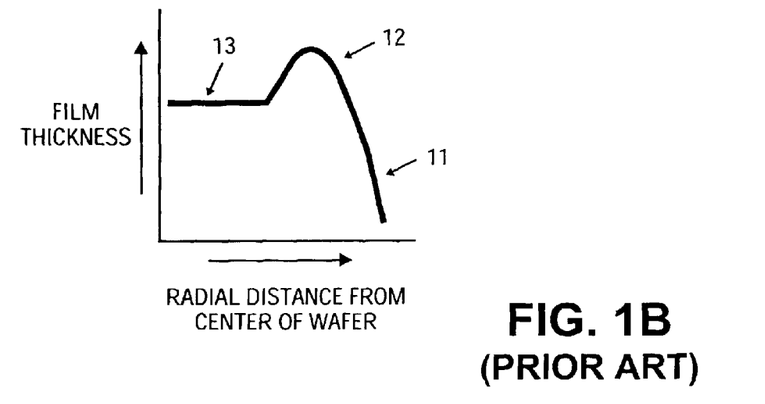
FIG. 1B is a graphic illustration of a prior art deposition process in which the deposition thickness of the film layer increases slightly before decreasing at the periphery of the wafer.
Figure 1C:
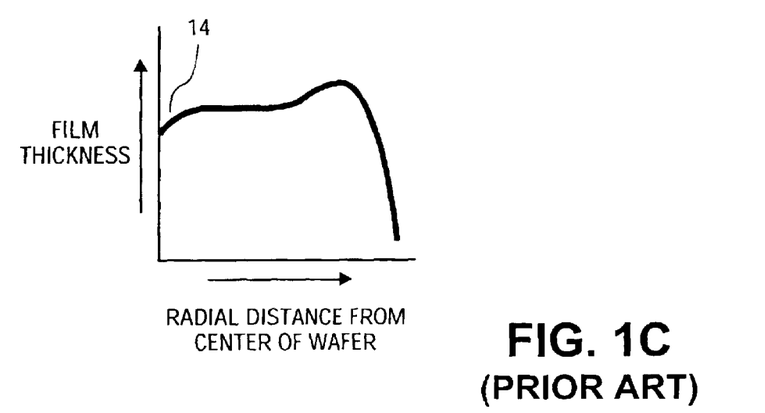
FIG. 1C is a graphic illustration of a prior art deposition process in which the deposition thickness of the film layer decreases at the center of the wafer, as well as at the periphery of the wafer.

Keeping with ALD processes, process parameters, such as deposition temperature and pressure, precursor doses, and purge times are generally optimized to yield highly uniform films with precisely controlled thickness. However, unlike other ALD processes, the uniformity of some films (such as ALD deposited $ZrO_2$ films) is observed to deteriorate with increasing number of processed wafers and/or accumulated film thickness. The following examples generally illustrate trends in ALD of $ZrO_2$ performed in a vertical flow warm wall ALD reactor, where the temperature of inner reactor surfaces, such as wall is in the range of 100 to 140° C. This temperature is substantially lower than the temperature of the $ZrCl_4$ container, which is in the range of 170–180° C. FIG. 1 (namely, FIGS. 1A, 1B and 1C) show representative examples of degradation trends in the thickness uniformity profile.

A first example illustration in FIG. 1A shows a graphic comparison of deposited film thickness over a radial profile of the wafer from its center to the periphery. As noted, the thickness profile of the deposited film is fairly uniform except near the periphery of the substrate (such as a semiconductor wafer). In reference to $ZrO_2$, as the total deposited $ZrO_2$ film thickness exceeds a certain thickness (usually greater than 50 Å, and more typically at around 300 Å), the uniformity starts to deteriorate at about location 10, and the film thickness is less towards the edge of the wafer, as shown at location 11. A variety of causes may contribute to the thickness deterioration at the periphery, but generally, it is due to insufficient saturation of the wafer surface by the precursor at the periphery. For example, the deterioration of uniformity of the deposited film may be attributed to depletion of at least the halide due to condensation on the interior surfaces of the warm wall reactor. That is, remnants of one precursor on the walls of the reactor chamber may cause parasitic deposition on the reactor wall with the introduction of the subsequent precursor. Accordingly, deposition occurs on the interior surfaces of the reactor that may be of inferior quality and thus may further deplete the precursor available for deposition on the wafer surface due to enhanced adsorbtion.

In a second example shown in FIG. 1B, the example illustrates a thickness profile of approximately 70 Å $ZrO_2$ film after approximately 1000 Å total $ZrO_2$ thickness has been deposited on previous wafers. Again, there is very little or no deposition towards the wafer edge at location 11. Furthermore, another feature characteristic of this profile is an area 12 with increased thickness, located between the relatively uniform deposition in the center region 13 and the edge location 11 of the wafer. This region of increased thickness is found to be generally independent of the processing conditions. The increased thickness of area 12 is likely due to parasitic deposition on the wafer occurring in parallel with the ALD reaction. Again the thinner deposition at the wafer edge is presumably due to a result of starved reaction, where one or both precursors are not present in sufficient quantity to reach saturation. The mechanism is likely related to the chemistry used in the particular ALD process, namely $ZrCl_4$ and $H_2O$. However, it may also be observed in the reaction of the precursor, $ZrCl_4$, with one of a variety of non-metallic reactants (oxiding and nitriding agents).

FIG. 1C illustrates a situation in which non-uniformity is noted at the center region 14 of the wafer, as well as at the periphery 11. It is possible that in some instances, parasitic deposition region 12 may also be appreciable. The decrease in the deposition thickness at the center of the wafer may be attributed in some instances to the presence of a distributor plate or "shower head" with blocked center area. Distributor plates and shower heads generally used in ALD and CVD reactors to distribute or disperse the gas at the inlet, so as to have even gas flow across the wafer surface. However, in comparison to the side walls of the reactor, the distribution structure(s) (e.g., distributor plate, shower head, etc.) may contribute more strongly to depletion of at least one of the precursors, $H_2O$ or a halide due to condensation, adsorption and parasitic deposition on the structure. This is because distribution structure(s) are typically located in the path of the precursor flow. As a result, generally, faster deterioration of film thickness uniformity may be observed in systems equipped with a distribution structure.

Furthermore, the non-uniform deposition thickness profile may manifest itself across a single processed wafer profile (thickness non-uniformity) or it may manifest the non-uniformness over repeated wafers (non repeatability). That is, although the first (or first set) of wafer depositions may be somewhat uniform, wafers processed subsequently may exhibit the deteriorating profile(s).

The profiles illustrated in FIGS. 1A, 1B and 1C are axi-symmetric and consistent with gas injection in vertical ALD reactor systems. The profile trend signature from an ALD reactor with horizontal flow may be different (consistent with unidirectional flow above the wafer), but uniformity problems may be present, similar to the vertical reactor systems.

In regards to the deposition of $HfO_2$, similar uniformity problems of ALD $HfO_2$ films may occur, but at a slower rate. This is because the $HfCl_4$ container is typically heated to a lower temperature in comparison with the $ZrCl_4$ container. Accordingly, precursor condensation on interior reactor surfaces is less pronounced. For example, it may take 500 to 1000 Å of total ALD $HfO_2$ film thickness to observe the change in uniformity at the periphery of the wafer.

The practice of the present invention establishes that certain passivation processes of the ALD/CVD reactor provide improved uniformity and repeatability of the ALD/CVD deposition process. In one particular embodiment for ALD processes, such passivation may be practiced by performing a short $Al_2O_3$ deposition on the interior of an ALD reactor chamber. In one embodiment, $Al_2O_3$ deposition may be practiced using an ALD sequence. For example, $Al_2O_3$ may be deposited using an organic Al precursor and an oxidizer. In one particular embodiment Tri-Methyl Aluminum (TMA) and $H_2O$ may be used as ALD precursors to deposit $Al_2O_3$. The passivation may be applied to coat the walls of the reactor and/or to coat exposed structures, such as distributor plates and shower heads The passivation deposition results in a deposition of a non-reactive layer (coating), which reduces adsorption of precursors and/or coat over remnant reactants from earlier introduction of precursor(s). Therefore, the passivation coating inhibits undesired reactions, which may detract from obtaining saturation of the precursor at the wafer surface. Furthermore, the passivation coating also inhibits the ability for parasitic deposition to occur, since parasitic reactions are reduced. With the deposition of the passivation layer as a coating on the reactor wall, as well as reactor components where previous precursor material may collect, improved uniformity is achieved, as shown in a substantially flat deposition profile of FIG. 2.

In one particular embodiment, a rapid switching ALD reactor system is employed to rapidly switch between deposition of $ZrO_2$ and $Al_2O_3$. In this respect, $ZrO_2$ film is deposited by ALD on the surface of a wafer. Prior to introducing a wafer into the reactor chamber, the reactor sidewall (as well as other structures in-line to the gas flow) is subjected to an $Al_2O_3$ deposition to condition the chamber.

After the $Al_2O_3$ deposition is completed, the wafer is transported into the reactor to undergo the $ZrO_2$ deposition. Then, the wafer is removed and followed by another $Al_2O_3$ conditioning, prior to the next wafer for depositing $ZrO_2$.

Figure 2:
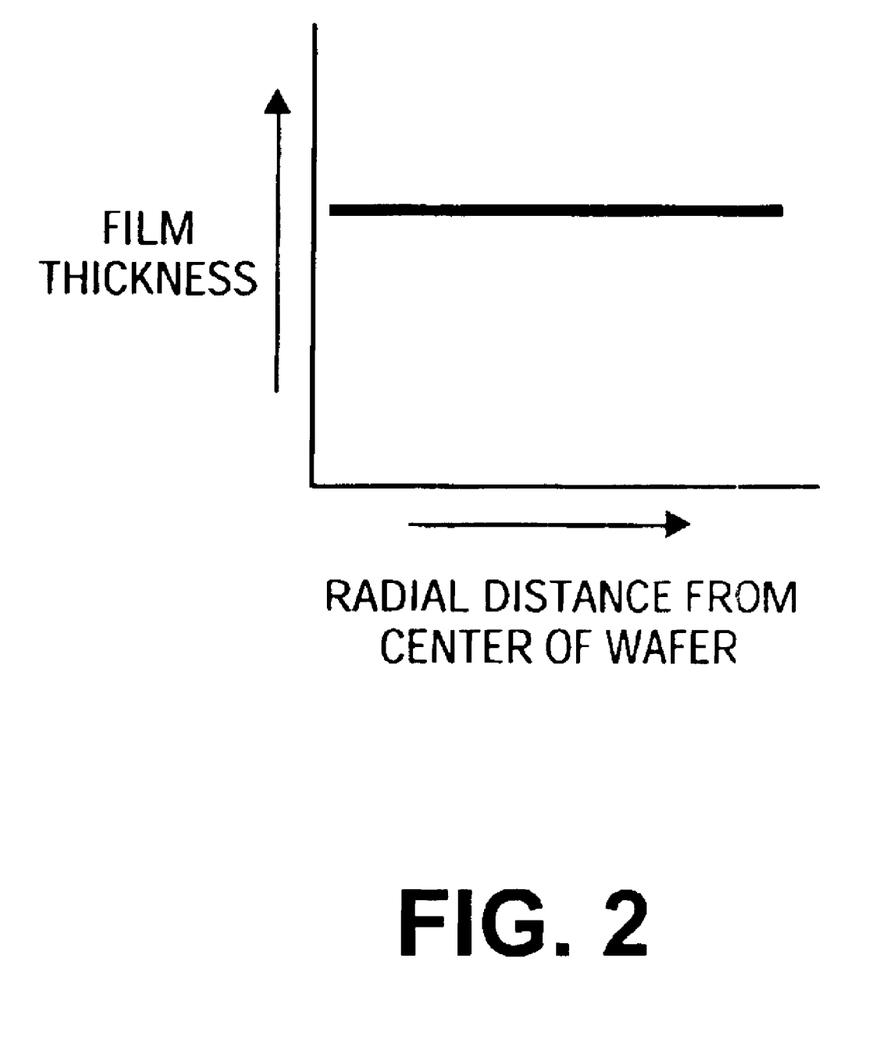
FIG. 2 is a graphic illustration of a deposition process in which a passivating layer applied to the interior of the reactor chamber improves the uniformity of the thickness of the film layer deposited.

The length of the $Al_2O_3$ conditioning process is optimized to give most stable performance for the particular ALD system and desired $ZrO_2$ film thickness, while satisfying the requirements for high throughput. For example, when $Al_2O_3$ is deposited by TMA and water, as little as 30 cycles of TMA and water (approximately 20 Å of $Al_2O_3$) may be sufficient to ensure repeatability in the deposition of ~100 Å $ZrO_2$ films. However, increasing the number of conditioning cycles to approximately 60, may allow formation of thicker, continuous $Al_2O_3$ layer and, thus, complete passivation of the ALD system, resulting in excellent process repeatability at the expense of only slightly lower throughput time. Again, the consistent thickness uniformity profile with the use of system passivation with $Al_2O_3$ is illustrated in FIG. 2.

It is to be noted that the passivation coating need not be performed after each wafer. Rather, depending on the desired $ZrO_2$ film thickness and the desired within wafer thickness uniformity specification, the above described sequence may be modified to perform chamber conditioning after a given number of $ZrO_2$ wafers is processed. For example, the procedure may be optimized to allow five to ten $ZrO_2$ films thinner than approximately 50 Å to be deposited between every chamber conditioning. In this example, wafer to wafer thickness repeatability specifications may be more relaxed. Thus, the passivation coating may be applied after a given number of wafers. Alternatively, $ZrO_2$ films thicker than approximately 500 Å may require chamber conditioning after every wafer. Various sequences of passivation and deposition may be practiced.

In a processing sequence where more than one wafers are processed in between chamber conditioning steps, there may be a first wafer effect. This refers to a trend in the deposition results, where the film characteristics on the first wafer, such as film thickness, growth rate or uniformity, may be different from the film characteristics on the remaining wafers in the set due to different wall conditions for the first wafer deposition. Specifically, the $ZrO_2$ film may exhibit lower growth rate on the first wafer. One approach to solve this difference is to add a small number of $ZrCl_4$ cycles, alternating with $H_2O$ cycles, at the end of the $Al_2O_3$ passivation recipe. The number of cycles may be optimized to satisfy a trade-off between throughput and uniformity specifications. For example, as little as five $ZrCl_4$ alternating with $H_2O$ cycles may be sufficient to prevent first wafer effect in a given ALD system. Increasing the number of these cycles may improve repeatability, but would also lower the throughput and shorten the time between chamber conditioning steps.

It is to be noted that the procedures described above may also be applied to ALD or CVD of oxide materials following a deposition reaction mechanism of the type: $ML_x + AH_z \rightarrow MA_y + HL$, where M is a metal; A is a non-metal; x, y and z are numbers; and MLx is a metal halide precursor, including but not limited to one, where M is one of: Zr, Hf, Ti, Ta, Al, Si, W, Zn, Mg, Ba, Bi, Pb, Sr, La and L is one of F, Cl, Br, I. Another example of low vapor pressure metal precursors are some metal nitrates $M(NO_3)x$, where M designates a metal atom and x is an integer.

It is to be noted that various combinations may be used to deposit the film layer following passivation, including the depositions of: metal oxide using respective metal chloride and $H_2O$; metal oxide using respective metal halide and $H_2O$; metal oxide using metal halide and an oxidizer; metal oxide using a low vapor pressure metal precursor and an oxidizer; alloy or nanolaminate film structure having at least a first sub-layer deposited using a low vapor pressure precursor, alloy or nanolaminate film structure having at least a first material deposited using a high vapor pressure precursor; and nitride equivalents thereof. Accordingly, a metal precursor with high vapor pressure or a gas may be combined with a nitriding or oxidizing agent. Examples of oxidizing agents include $H_2O$, $H_2O_2$, $O_2$, $O_3$ and alcohol (R—OH, where R designates an alkyl group). Examples of nitriding agents include $NH_3$, $N_2H_4$ and $N_2$. These are example only and are not for the purpose of limiting the invention.

For example, all procedures described above may be applied to ALD of $HfO_2$, in which $HfCl_4$ and $H_2O$ are used to deposit $HfO_2$. The uniformity of ALD $HfO_2$ films generally changes in a way similar to the $ZrO_2$, however at a slower rate. For example, it may take 500 to 1000 Å of ALD $HfO_2$ film thickness to observe the change in uniformity. Similar to the ALD of $ZrO_2$, the ALD $HfO_2$ film uniformity recovers after chamber conditioning by the passivation coating. With respect to this difference, a procedure where the chamber conditioning is carried out after a given number of wafers, such as every five to twenty-five wafers (or deposition cycles), may be more applicable for ALD of $HfO_2$.

Alloying the $ZrO_2$ and $HfO_2$ with $Al_2O_3$ to form the respective aluminates improves the repeatability, as chamber passivation occurs simultaneously with the ALD deposition during the $Al_2O_3$ part of the deposition sequence. Similarly, the deposition of $ZrO_2/Al_2O_3$ or $HfO_2/Al_2O_3$ nanolaminate structures also provides good process stability. Thus, in the processing of alloy or nanolaminate films the ALD system passivation may be used, but with less frequency of passivation coating.

Other methods for system passivation may involve plasma treatment. Plasma could be established in the ALD or CVD reactor and system during exposure of non-metal precursors (—AHz, such as $H_2O$, $H_2O_2$ or alcohol (R—OH, where R designates an alkyl group)), as well as gasses such as $H_2$ and $O_2$.). Generally, the passivation layer can be deposited using most any CVD or ALD based process.

Furthermore, when nitride based film deposition (TaNx, ZrNx, HfNx, etc., where x is a number) from the respective low vapor pressure precursors are desired, instead of $Al_2O_3$, $AlN_x$ (where x is –a number) may be deposited as the passivation coating. $AlN_x$ may be deposited from a metal organic Al precursor and a nitriding agent, such as $NH_3$, $N_2H_4$ or $N_2$. $AlN_x$ may be deposited using thermal ALD or CVD or using plasma based process. Other examples of passivation materials include, but are not limited to $SiO_2$, SiNx and BNx, deposited using high vapor pressure precursors or gases.

The described reactor chamber passivation technique reacts and/or coats surfaces inside the ALD reactor to restore the chamber to a desirable state for reproducible ALD deposition employing the various described chemistries. The mechanism for improved reproducibility may include, but is not limited to passivation of conduits, valves, reactor surfaces leading to the reaction surface of the wafer upon which the $ZrO_2$, $HfO_2$, or other material is deposited.

Furthermore, it is to be noted that generally, the lower the vapor pressure of the precursor, the more frequently the passivation precoat is to be carried out. For example, $Ta_2O_5$ may require it very infrequently, $HfO_2$ may require precoat somewhat frequently, and $ZrO_2$ may require it frequently (as often as after every wafer). This is due to the decrease in the vapor pressure from $TaCl_5$ through $HfCl_4$ to $ZrCl_4$. For example, in order to generate approximately 1 Torr of vapor pressure the $TaCl_5$, $HfCl_4$ and $ZrCl_4$ precursor material has to heated to about 120, 180, and 190° C., respectively. Generally, as the vapor pressure of the metal precursor decreases, more frequent the need for the passivation coating due to increased tendency for condensation. Typically, for the passivation layer/coating, it is deposited from high vapor pressure precursors and is non-reactive with respect to the precursors used to deposit the desired film. Additionally, the passivation coating need not be performed with the same process as the one used to deposit the film on the wafer. The growth rate (and consequently the throughput) may be increased by, for example, shortening the pulse and/or purge times compared to the ones used in a standard ALD deposition. Furthermore, other oxide films of interest may also include very high-k materials and ferroelectric films, such as barium strontium titanate (BST), led zirconium titanate (PZT), etc. In addition to conventional semiconductor applications, the passivation techniques described may be adapted for use for optoelectronics applications, flat panel displays, superconducting oxide films, as well as others.

It is to be noted that the embodiments described above may be performed in a variety of reactor chambers utilized for deposition of film layers. However, as noted, the described techniques for passivation are generally practiced with cold/warm wall reactors employing ALD or CVD processes. Thus, one example ALD system is illustrated in FIG. 3 and an example CVD system is illustrated in FIG. 4.

Figure 3:
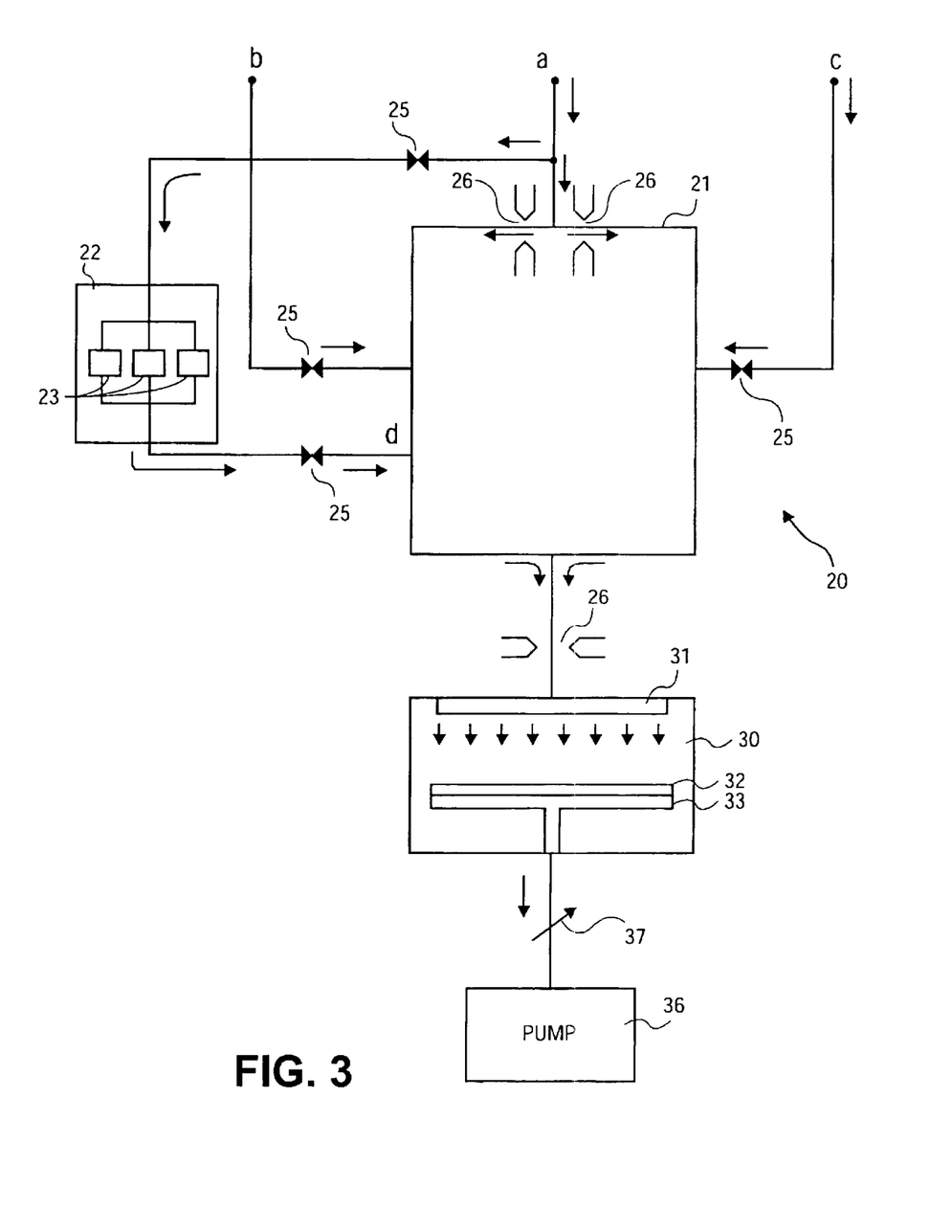
FIG. 3 is one representative example of an ALD reactor system to utilize the passivation technique of the present invention.
Figure 4:
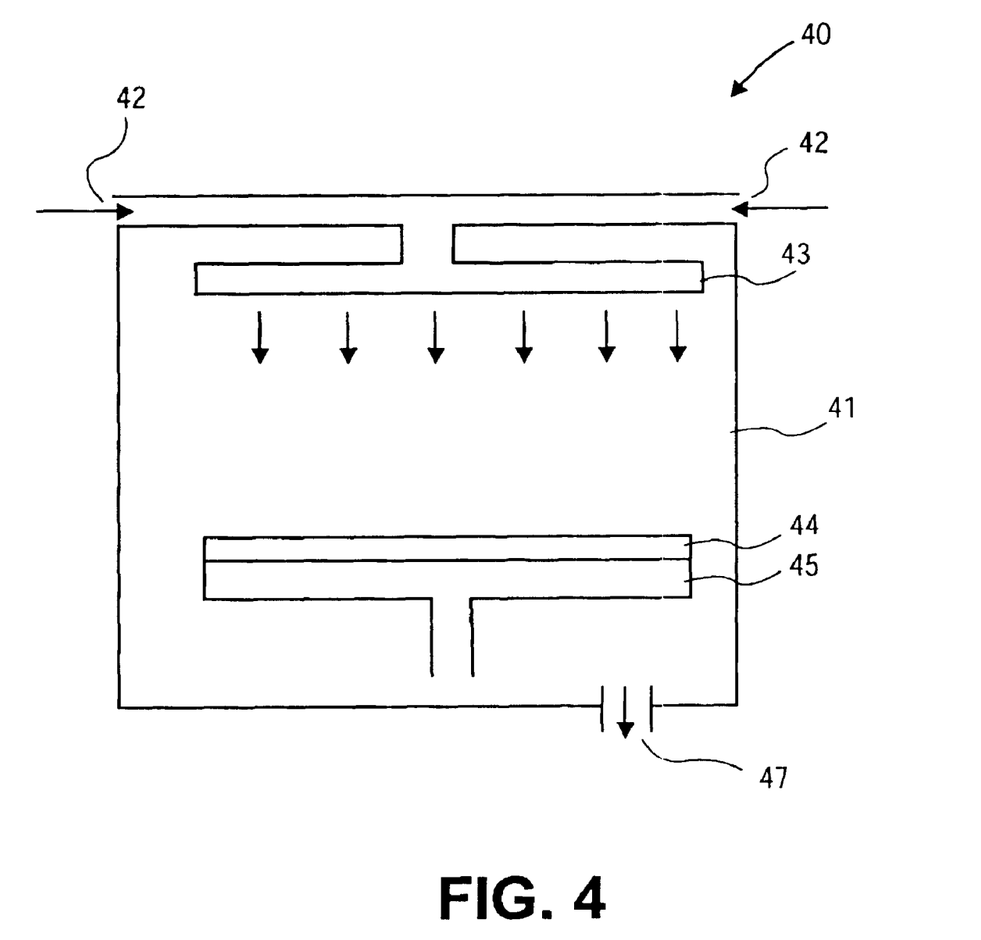
FIG. 4 is one representative example of a CVD reactor system to utilize the passivation technique of the present invention.

Referring to FIG. 3, it shows one embodiment of an ALD system 20, having a switching manifold 21. The switching manifold 21 is coupled to a chemical source array 22, which may contain one or more chemical source(s) 23. Low vapor pressure precursor chemicals are typically contained within the source array 22.

In FIG. 3, an inert gas (such as nitrogen or argon) enters the manifold 21 at inlet "a" and is routed through a by-pass to the source array 22. The main flow is to the manifold 21, which has a split flow design to have more than one path for the gas flow. In the example diagram, two flow paths are shown in the manifold 21. Inlet "b" is coupled to one path, while inlet "c" is coupled to the other path. Various chemicals are introduced through inlets "b" and "c". In one embodiment, non-metals are introduced through inlet "c", while metal chemicals are introduced through inlet "b", both at ordinary vapor pressure. The low vapor pressure source(s) is/are introduced to the manifold 21 through inlet "d". As noted valves 25 and the passing through a port 26 control and/or regulate the flow.

The split flow of carrier gas is introduced into a reactor chamber 30 of a processing reactor. The separate flow may be kept separate to enter the chamber 30 or, alternatively as shown, the split flow may be recombined at the manifold prior to being introduced into the chamber 30 through port 26. The chamber 30 may include a distributor plate (or shower head) 31. The substrate 32 or other workpiece receiving the deposition resides in the chamber 30, typically atop a chuck (or support) 33. Downstream, a pump 36 may be present to provide low or vacuum pressure to sustain the gas flow. A throttle valve 37 may be present to regulate the flow.

Accordingly, with the ALD system 20, low vapor pressure precursors for ALD deposition of the film layer on the substrate is provided by the source 23 and introduced into the manifold 21 at inlet "d". The passivation chemistry may be introduced through inlets "b", "c" and/or "d", depending on the chemistry. In the example of having TMA and $H_2O$ deposit $Al_2O_3$ by ALD, the TMA is introduced through inlet "b" and $H_2O$ is introduced through inlet "c". Thus, ALD system may employ ALD processes to deposit the passivation material. In other embodiments, the passivation layer may be obtained without ALD, but the film layer deposited on the substrate may still employ ALD or CVD.

One advantage of an ALD system, such as the ALD system of FIG. 3, is the ability to deposit just a few monolayers of the passivation material, as well as the film layer deposited on the substrate. The ability to control the molecular monolayer allows tight tolerances and control of the deposition process. When the passivation coating is deposited by ALD, the deposition thickness may be controlled to few (approximately 1 to 10) monolayers or many more monolayers.

A CVD system 40 having a reactor chamber 41 is shown in FIG. 4. In a typical CVD reactor, the precursors are applied together, instead of in separate stages. One or more inlets 42 introduce the precursors, which are usually distributed and dispersed through a distribution plate or a shower head 43. A substrate (or workpiece) 44 resides atop a chuck or support 45. A CVD process then results in the deposition of the film layer when precursor chemicals are introduced into the chamber 41. Spent gases are exhausted through opening 47.

As with the ALD system of FIG. 3, the CVD system may also introduce the passivating chemistry through one or more of the inlets to the chamber 42. In both systems, the passivating chemistry will coat the interior of the chamber walls, and other structures, which come in contact. The practice of depositing the passivating layer may be practiced in a variety of other reactor designs and are not limited to the two examples shown in FIGS. 3 and 4.

Thus, passivation method for improved uniformity and repeatability for atomic layer deposition and chemical vapor deposition is described. Although the passivating layer is more applicable to cold wall or warm wall ALD and/or CVD reactors, the passivation technique is not limited to such reactor types.

We claim:

1. A method comprising:
   depositing a passivating layer of a first material on an interior reactor surface of a cold or warm wall reactor, in which the first material is non-reactive with one or more precursors used to form a second material; and
   depositing a film layer of the second material on a substrate by subjecting the substrate to the one or more precursors, in which at least one precursor has a low vapor pressure.

2. The method of claim 1 wherein said depositing of the passivating layer and the film layer are performed in an ALD or CVD reactor.

3. The method of claim 1, wherein said depositing of the passivating layer is performed by ALD or CVD technique.

4. The method of claim 2, wherein said depositing the passivating layer deposits $Al_2O_3$.

5. The method of claim 4, wherein depositing $Al_2O_3$ forms $Al_2O_3$ from Tri Methyl Aluminum (TMA) and $H_2O$.

6. The method of claim 4, wherein depositing $Al_2O_3$ forms $Al_2O_3$ from a metal organic Al precursor and an oxidizer.

7. The method of claim 2, wherein said depositing the passivating layer deposits $AlN_x$, where x is an number, from a metal organic Al precursor and a nitriding agent.

8. The method of claim 2, wherein said depositing the passivating layer deposits the passivating layer from a gas or high vapor pressure metal precursor and a nitriding or oxidizing agent.

9. The method of claim 2, wherein the second material is $ZrO_2$ deposited on the substrate using $ZrCl_4$ and $H_2O$.

10. The method of claim 2, wherein the second material is a metal oxide deposited on the substrate using the respective metal chloride and $H_2O$.

11. The method of claim 2, wherein the second material is a metal oxide deposited on the substrate using the respective metal halide and $H_2O$.

12. The method of claim 2, wherein the second material is a metal oxide formed from a group consisting of an oxide of Zr, Hf, Ti, Ta, Al, Si, W, Zn, Mg, Ba, Bi, Pb, La and Sr, deposited on the substrate using a respective metal halide and $H_2O$.

13. The method of claim 2, wherein the second material is a metal oxide formed from a group consisting of an oxide of Zr, Hf, Ti, Ta, Al, Si, W, Zn, Mg, Ba, Bi, Pb, La and Sr, deposited on the substrate using a respective metal halide and an oxidizer.

14. The method of claim 2, wherein the second material is a metal oxide formed from a group consisting of an oxide of Zr, Hf, Ti, Ta, Al, Si, W, Zn, Mg, Ba, Bi, Pb, La and Sr, deposited on the substrate using a respective low vapor pressure metal precursor and an oxidizing or nitriding agent.

15. The method of claim 2, wherein the second material is an alloy or nanolaminate film structure including at least a first component or sub-layer deposited using a low vapor pressure precursor.

16. A method comprising:
    depositing a passivating layer of a first material on an interior reactor surface of a cold or warm wall reactor, in which the first material is non-reactive with one or more precursors used to form a second material; and
    depositing a film layer of the second material on a substrate by subjecting the substrate to the one or more precursors, in which at least one precursor has a low vapor pressure; the passivating layer to improve uniformity and repeatability of the second material.

17. The method of claim 16 wherein said depositing of the passivating layer and the film layer are performed in an ALD or CVD reactor.

18. The method of claim 16 wherein said depositing of the passivating layer is performed by ALD or CVD technique.

19. The method of claim 17, wherein said depositing the passivating layer deposits $Al_2O_3$.

20. The method of claim 19, wherein depositing $Al_2O_3$ forms $Al_2O_3$ from Tri Methyl Aluminum (TMA) and $H_2O$.

21. The method of claim 19, wherein depositing $Al_2O_3$ forms $Al_2O_3$ from a metal organic Al precursor and an oxidizer.

22. The method of claim 17, wherein said depositing the passivating layer deposits $AlN_x$, where x is an number, from a metal organic Al precursor and a nitriding agent.

23. The method of claim 17, wherein said depositing the passivating layer deposits the passivating layer from a gas or high vapor pressure metal precursor and a nitriding or oxidizing agent.

24. The method of claim 17, wherein the second material is $ZrO_2$ deposited on the substrate using $ZrCl_4$ and $H_2O$.

25. The method of claim 17, wherein the second material is a metal oxide deposited on the substrate using the respective metal chloride and $H_2O$.

26. The method of claim 17, wherein the second material is a metal oxide deposited on the substrate using the respective metal halide and $H_2O$.

27. The method of claim 17, wherein the second material is a metal oxide formed from a group consisting of an oxide of Zr, Hf, Ti, Ta, Al, Si, W, Zn, Mg, Ba, Bi, Pb, La and Sr, deposited on the substrate using a respective metal halide and $H_2O$.

28. The method of claim 17, wherein the second material is a metal oxide formed from a group consisting of an oxide of Zr, Hf, Ti, Ta, Al, Si, W, Zn, Mg, Ba, Bi, Pb, La and Sr, deposited on the substrate using a respective metal halide and an oxidizer.

29. The method of claim 17, wherein the second material is a metal oxide formed from a group consisting of an oxide of Zr, Hf, Ti, Ta, Al, Si, W, Zn, Mg, Ba, Bi, Pb, La and Sr, deposited on the substrate using a respective low vapor pressure metal precursor and an oxidizing or nitriding agent.

30. The method of claim 17, wherein the second material is an alloy or nanolaminate film structure including at least a first component or sub-layer deposited using a low vapor pressure precursor.

* * * * *